(12) United States Patent
Onozeki et al.

(10) Patent No.: US 11,444,054 B2
(45) Date of Patent: Sep. 13, 2022

(54) SEMICONDUCTOR ELEMENT MOUNTING STRUCTURE, AND COMBINATION OF SEMICONDUCTOR ELEMENT AND SUBSTRATE

(71) Applicant: Hitachi Chemical Company, Ltd., Tokyo (JP)

(72) Inventors: Hitoshi Onozeki, Tokyo (JP); Shizu Fukuzumi, Tokyo (JP); Naoya Suzuki, Tokyo (JP); Toshihisa Nonaka, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/646,642

(22) PCT Filed: Sep. 14, 2018

(86) PCT No.: PCT/JP2018/034302
§ 371 (c)(1),
(2) Date: Mar. 12, 2020

(87) PCT Pub. No.: WO2019/054509
PCT Pub. Date: Mar. 21, 2019

(65) Prior Publication Data
US 2020/0273837 A1    Aug. 27, 2020

(30) Foreign Application Priority Data

Sep. 15, 2017  (JP) .............................. JP2017-177487

(51) Int. Cl.
*H01L 23/00*  (2006.01)
(52) U.S. Cl.
CPC .............. *H01L 24/81* (2013.01); *H01L 24/13* (2013.01); *H01L 24/16* (2013.01);
(Continued)

(58) Field of Classification Search
CPC . H01L 2224/13082; H01L 2224/16227; H01L 2224/16238; H01L 24/81; H01L 24/13; H01L 24/16; H01L 2924/014
(Continued)

(56) References Cited

U.S. PATENT DOCUMENTS

| 2010/0314745 | A1* | 12/2010 | Masumoto | ........ H01L 23/49811 257/692 |
| 2013/0069221 | A1* | 3/2013 | Lee | ........................ H01L 24/13 257/737 |
| 2013/0299965 | A1* | 11/2013 | Gandhi | ................... H01L 24/13 257/737 |

FOREIGN PATENT DOCUMENTS

| JP | H10-270498 A | 10/1998 |
| JP | 2000-003933 A | 1/2000 |

(Continued)

*Primary Examiner* — Didarul A Mazumder
(74) *Attorney, Agent, or Firm* — Fitch, Even, Tabin & Flannery, LLP

(57) ABSTRACT

Provided is a semiconductor element mounting structure, including: a semiconductor element including an element electrode, and a substrate including a substrate electrode that is provided on a surface facing the semiconductor element at a position facing the element electrode, the semiconductor element and the substrate being connected via the element electrode and the substrate electrode, in which: one of the element electrode or the substrate electrode is a first protruding electrode including a solder layer at a tip portion thereof, the other of the element electrode or the substrate electrode is a first electrode pad including one or more metal protrusions on a surface thereof, the one or more metal protrusions of the first electrode pad extend into the solder layer of the first protruding electrode, and a bottom area of each of the one or more metal protrusions of the first electrode pad is 70% or less with respect to an area of the first electrode pad, or 75% or less with respect to a maximum (Continued)

cross-sectional area of the solder layer of the first protruding electrode.

20 Claims, 5 Drawing Sheets

(52) U.S. Cl.
CPC ............... *H01L 2224/13013* (2013.01); *H01L 2224/13014* (2013.01); *H01L 2224/13082* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13211* (2013.01); *H01L 2224/13213* (2013.01); *H01L 2224/13239* (2013.01); *H01L 2224/13244* (2013.01); *H01L 2224/13247* (2013.01); *H01L 2224/16227* (2013.01); *H01L 2224/16238* (2013.01); *H01L 2224/81024* (2013.01); *H01L 2224/81385* (2013.01); *H01L 2224/81815* (2013.01); *H01L 2924/014* (2013.01)

(58) Field of Classification Search
USPC .......................................... 257/737; 438/613
See application file for complete search history.

(56) References Cited

FOREIGN PATENT DOCUMENTS

| | | |
|---|---|---|
| JP | 2001-223227 A | 8/2001 |
| JP | 2002-283098 A | 10/2002 |
| JP | 2003-031613 A | 1/2003 |
| JP | 2003-45911 A | 2/2003 |
| JP | 2005-272547 A | 10/2005 |
| JP | 2006-169407 A | 6/2006 |
| JP | 2006-188573 A | 7/2006 |
| JP | 2007-043010 A | 2/2007 |
| JP | 2008-294382 A | 12/2008 |
| JP | 2015-228524 A | 12/2015 |

* cited by examiner

SEMICONDUCTOR ELEMENT MOUNTING STRUCTURE, AND COMBINATION OF SEMICONDUCTOR ELEMENT AND SUBSTRATE

CROSS-REFERENCE TO RELATED APPLICATIONS

This application is a U.S. national phase application filed under 35 U.S.C. § 371 of International Application No. PCT/JP2018/034302, filed Sep. 14, 2018, designating the United States, which claims priority from Japanese Patent Application No. 2017-177487, filed Sep. 15, 2017, the entire contents of which are hereby incorporated herein by reference.

TECHNICAL FIELD

The present invention relates to a semiconductor element mounting structure, and a combination of a semiconductor element and a substrate.

BACKGROUND ART

Conventionally, a wire bonding connection method using a thin metal wire such as a gold wire has been known as a method for mounting a semiconductor element on a substrate. On the other hand, in response to demands for miniaturization, thinning, high functionality, high integration, high speed, or the like of semiconductor devices, a flip-chip connection method (FC connection method) for connecting a semiconductor element and a substrate via conductive protrusions called bumps is spreading. The FC connection method is heavily used in Ball Grid Array (BGA), Chip Size Package (CSP), or the like for connecting a semiconductor element and a substrate. A Chip On Board (COB) type connection method also corresponds to the FC connection method. The FC connection method is also widely used for a Chip On Chip (COC) type connection method for connecting semiconductor elements (for example, see Patent Document 1).

In response to demands for further miniaturization, thinning, and higher functionality of semiconductor devices, a chip stack type package and Package On Package (POP), in which layering and multi-staging are carried out by the above-described connection method, have been widely used. A Through-Silicon Via (TSV) method is also being widely used. Such a layering and multi-staging technique three-dimensionally arranges semiconductor elements and the like, and thus can reduce a package area as compared with a method of two-dimensionally arranging semiconductor elements and the like. In particular, the TSV technology is effective for improving the performance of semiconductors, reducing noise, reducing the mounting area, and saving power, and is attracting attention as a next-generation semiconductor wiring technology.

A conductive material is used for a connecting portion including a bump or a wiring. Specific examples of the conductive material include solder, tin, gold, silver, copper, nickel, and a metal material containing a plurality of these. When an oxide film is formed on the surface of a metal constituting a connecting portion or impurities such as oxides are attached to the surface of a metal constituting a connecting portion, there is a concern that the connectivity between circuit members to be connected and the insulation reliability may be reduced, and the merit of employing the above-described connection method may be impaired.

Examples of a method for suppressing such a problem include a method of performing, before connection, a pretreatment by applying a pre-flux, a rust preventive agent, or the like used for an Organic Solderability Preservative (OSP) treatment onto at least one of the substrate surface or the surface of a semiconductor element. However, after a pretreatment, a pre-flux, a rust preventive agent, or the like remains in a connecting portion, and the remaining pre-flux, rust preventive agent, or the like may deteriorate, as a result of which the connection reliability of the connecting portion decreases.

On the other hand, according to a method of sealing a connecting portion between a semiconductor element and a substrate with a semiconductor adhesive, electrical connection between circuit members and sealing of the connecting portion can be performed collectively. This can suppress oxidation of a metal used for a connecting portion, attachment of impurities to the connecting portion, or the like, and protect the connecting portion from the external environment. Therefore, connectivity, insulation reliability, processability, productivity, and the like can be effectively improved.

When manufacturing a semiconductor device by an FC connection method, a thermal stress resulting from difference in thermal expansion coefficient between a semiconductor element and a substrate, or difference in thermal expansion coefficient between semiconductor elements may concentrate on a connecting portion to cause a connection failure. In order to prevent a connection failure resulting from difference in thermal expansion coefficient, it is effective to seal a gap between two adjacent circuit members (semiconductor element, substrate, and the like) with an adhesive composition. In particular, since components different in thermal expansion coefficient are often used for a semiconductor element and a substrate, it is demanded to seal a semiconductor device with an adhesive composition to improve the thermal shock resistance.

The FC connection method using an adhesive composition can be roughly classified into a Capillary-Flow method and a Pre-Applied method (for example, see Patent Documents 2 to 6). The Capillary-Flow method is a method in which, after connecting a semiconductor element and a substrate, a liquid adhesive composition is injected into a gap between the semiconductor element and the substrate by a capillary phenomenon. The Pre-Applied method is a method in which a paste or a film-like adhesive composition is supplied onto a semiconductor element or a substrate before the semiconductor element and the substrate are connected, and then the semiconductor element and the substrate are connected.

In order to increase the bonding strength between a protruding electrode of a semiconductor element and an electrode pad of a wiring board for mounting and improve mounting reliability, a semiconductor element mounting structure is disclosed, in which a semiconductor element with a protruding electrode formed on the element surface is joined to a wiring board with an electrode pad provided with a metal protrusion at a position facing the protruding electrode on a top face of an insulating substrate in such a manner that the protruding electrode and the metal protrusion are aligned, in which a top of the metal protrusion is extended into the protruding electrode, and in which an angle formed between a side surface of the metal protrusion and the top face of the electrode pad, and an angle formed between a side face of the metal protrusion and a side face of the protruding electrode at a junction are 90° or more, respectively (for example, see Patent Document 7).

CITATION LIST

Patent Literature

Patent Document 1: Japanese Patent Application Laid-Open (JP-A) No. 2008-294382
Patent Document 2: JP-A 2001-223227
Patent Document 3: JP-A 2002-283098
Patent Document 4: JP-A 2005-272547
Patent Document 5: JP-A 2006-169407
Patent Document 6: JP-A 2006-188573
Patent Document 7: JP-A 2003-45911

SUMMARY OF INVENTION

Technical Problem

Generally, in manufacturing a semiconductor device in a Pre-Applied method using an adhesive composition (underfill material), an underfill material is provided between a semiconductor element and a substrate, and heat curing of the underfill material is performed. Currently, in this method, provision of an underfill material between a semiconductor element and a substrate and heat curing of the underfill material are performed for each semiconductor device. For this reason, the manufacturing efficiency of a semiconductor device using an underfill material of the existing Pre-Applied method is poor, and improvement of the manufacturing efficiency is an important issue.

As an FC connection method capable of reducing costs, there is a method using a conductive paste. In this method, after forming a protruding electrode on a semiconductor element, a conductive paste is transferred onto a tip portion of the protruding electrode, and the protruding electrode is brought into contact with a substrate electrode to achieve electrical conduction. The connection resistance in this method depends on the thickness of a conductive paste, the filling rate of conductive particles, or the like, and generally has a problem that the connection resistance is higher than that of solder connection.

As a method for solving such a situation, a method in which a semiconductor element is temporarily mounted on a substrate in the absence of an adhesive composition, a batch solder connection is performed by reflow, an underfill material is provided by a Capillary-Flow method, and the underfill material is cured by heating is considered. However, with the recent progress in miniaturization of semiconductor devices, connecting portions including bumps or wirings of semiconductor elements represented by memories and logics are also becoming narrower in pitch. For this reason, when solder connection is performed by reflow after a semiconductor element is temporarily mounted on a substrate without an adhesive composition, vibration during reflow as a heating process and connecting portion misalignment due to handling of a substrate may occur. When a semiconductor element is formed into a multilayer by a TSV method, the semiconductor element is very unstable after temporal mounting, and therefore, when batch solder connection is performed by reflow, misalignment may occur at a connecting portion for the same reason. In the case in which misalignment occurs at a connecting portion, the connection accuracy between a semiconductor element and a substrate deteriorates.

One embodiment of the present invention has been made in view of the above-described conventional circumstances, and an object of the one embodiment of the present invention is to provide a semiconductor element mounting structure having excellent connection accuracy between a semiconductor element and a substrate. Further, an object of another embodiment of the present invention is to provide a combination of a semiconductor element and a substrate which is less likely to cause misalignment at a connecting portion between the semiconductor element and the substrate.

Solution to Problem

Specific means for achieving the above-described objects includes the following aspect.

<1> A semiconductor element mounting structure, including:
a semiconductor element including an element electrode, and a substrate including a substrate electrode that is provided on a surface facing the semiconductor element at a position facing the element electrode, the semiconductor element and the substrate being connected via the element electrode and the substrate electrode, in which:
one of the element electrode or the substrate electrode is a first protruding electrode including a solder layer at a tip portion thereof,
the other of the element electrode or the substrate electrode is a first electrode pad including one or more metal protrusions on a surface thereof,
the one or more metal protrusions of the first electrode pad extend into the solder layer of the first protruding electrode, and
a bottom area of each of the one or more metal protrusions of the first electrode pad is 75% or less with respect to a maximum cross-sectional area of the solder layer of the first protruding electrode.

<2> The semiconductor element mounting structure according to <1>, in which:
at an opposite side of the semiconductor element from the side facing the substrate, one or more further semiconductor elements are layered in a state such that each semiconductor element is connected via an element electrode,
in two of the further semiconductor elements that are disposed in a connected relationship, one of an element electrode of one further semiconductor element or an element electrode of the other further semiconductor element is a second protruding electrode including a solder layer at a tip portion thereof,
the other of the element electrode of the one further semiconductor element or the element electrode of the other further semiconductor element is a second electrode pad including one or more metal protrusions on a surface thereof,
the one or more metal protrusions of the second electrode pad extend into the solder layer of the second protruding electrode, and
a bottom area of each of the one or more metal protrusions of the second electrode pad is 75% or less with respect to a maximum cross-sectional area of the solder layer of the second protruding electrode.

<3> The semiconductor element mounting structure according to <1> or <2>, in which a shape of each of the one or more metal protrusions is a cylindrical column or a rectangular parallelepiped.

<4> The semiconductor element mounting structure according to any one of <1> to <3>, in which each of the one or more metal protrusions has a shape in which at least two cylindrical columns or rectangular parallelepipeds are stacked in a height direction.

<5> The semiconductor element mounting structure according to any one of <1> to <4>, in which each of the one or more metal protrusions is photolithographically formed.

<6> The semiconductor element mounting structure according to any one of <1> to <5>, obtained by temporarily fixing the semiconductor element and the substrate in a state in which at least a portion of the one or more metal protrusions of the first electrode pad is extended into the solder layer of the first protruding electrode by pressurization, and melting the solder layer of the first protruding electrode by heating to connect the element electrode and the substrate electrode.

<7> A combination of a semiconductor element and a substrate, including:

a semiconductor element including an element electrode, and a substrate including a substrate electrode that is provided on a surface facing the semiconductor element at a position facing the element electrode, in which:

one of the element electrode or the substrate electrode is a protruding electrode including a solder layer at a tip portion thereof, the other of the element electrode or the substrate electrode is an electrode pad including one or more metal protrusions on a surface thereof, and a bottom area of each of the one or more metal protrusions is 75% or less with respect to a maximum cross-sectional area of the solder layer of the protruding electrode.

<8> A semiconductor element mounting structure, including:

a semiconductor element including an element electrode, and a substrate including a substrate electrode that is provided on a surface facing the semiconductor element at a position facing the element electrode, the semiconductor element and the substrate being connected via the element electrode and the substrate electrode, in which:

one of the element electrode or the substrate electrode is a first protruding electrode including a solder layer at a tip portion thereof, the other of the element electrode or the substrate electrode is a first electrode pad including one or more metal protrusions on a surface thereof, the one or more metal protrusions of the first electrode pad extend into the solder layer of the first protruding electrode, and a bottom area of each of the one or more metal protrusions of the first electrode pad is 70% or less with respect to an area of the first electrode pad.

<9> The semiconductor element mounting structure according to <8>, in which:

at an opposite side of the semiconductor element from the side facing the substrate, one or more further semiconductor elements are layered in a state such that each semiconductor element is connected via an element electrode, in two of the further semiconductor elements that are disposed in a connected relationship, one of an element electrode of one further semiconductor element or an element electrode of the other further semiconductor element is a second protruding electrode including a solder layer at a tip portion thereof, the other of the element electrode of the one further semiconductor element or the element electrode of the other further semiconductor element is a second electrode pad including one or more metal protrusions on a surface thereof, the one or more metal protrusions of the second electrode pad extend into the solder layer of the second protruding electrode, and a bottom area of each of the one or more metal protrusions of the second electrode pad is 70% or less with respect to an area of the second electrode pad.

<10> The semiconductor element mounting structure according to <8> or <9>, in which a shape of each of the one or more metal protrusions is a cylindrical column or a rectangular parallelepiped.

<11> The semiconductor element mounting structure according to any one of <8> to <10>, in which each of the one or more metal protrusions has a shape in which at least two cylindrical columns or rectangular parallelepipeds are stacked in a height direction.

<12> The semiconductor element mounting structure according to any one of <8> to <11>, in which each of the one or more metal protrusions is photolithographically formed.

<13> The semiconductor element mounting structure according to any one of <8> to <12>, obtained by temporarily fixing the semiconductor element and the substrate in a state in which at least a portion of the one or more metal protrusions of the first electrode pad is extended into the solder layer of the first protruding electrode by pressurization, and melting the solder layer of the first protruding electrode by heating to connect the element electrode and the substrate electrode.

<14> A combination of a semiconductor element and a substrate, including:

a semiconductor element including an element electrode, and a substrate including a substrate electrode that is provided on a surface facing the semiconductor element at a position facing the element electrode, in which:

one of the element electrode or the substrate electrode is a protruding electrode including a solder layer at a tip portion thereof, the other of the element electrode or the substrate electrode is an electrode pad including one or more metal protrusions on a surface thereof, and a bottom area of each of the one or more metal protrusions is 70% or less with respect to an area of the electrode pad.

Advantageous Effects of Invention

According to one embodiment of the present invention, a semiconductor element mounting structure having excellent connection accuracy between a semiconductor element and a substrate can be provided. According to another embodiment of the present invention, a combination of a semiconductor element and a substrate which is less likely to cause misalignment at a connecting portion between the semiconductor element and the substrate can be provided.

DESCRIPTION OF EMBODIMENTS

Figure 1A:
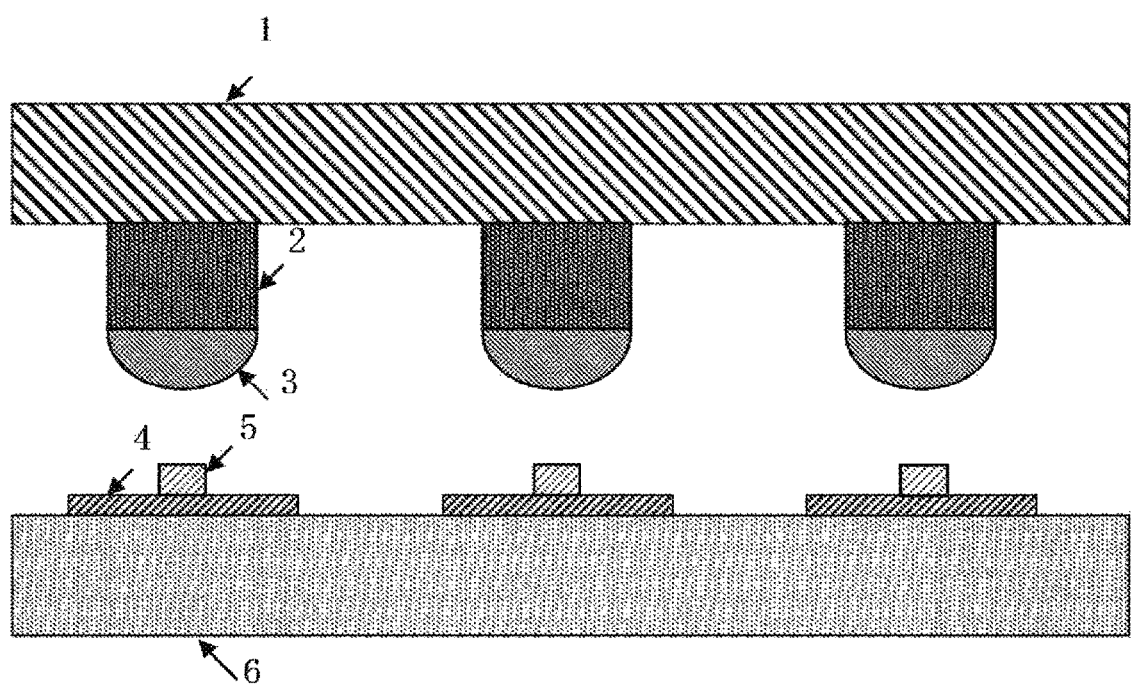
FIG. 1A is a sectional view of a main part showing a state before a semiconductor element and a substrate are connected.

Hereinafter, an example of a semiconductor element mounting structure to which the present invention is applied and an example of a combination of a semiconductor element and a substrate to which the present invention is applied will be more specifically described with reference to the drawings. However, the present invention is not limited to the following disclosure. Components (including element steps and the like) in the following disclosure are not essential unless otherwise specified. The same applies to numerical values and their ranges, and does not limit the present invention. The size of the members in each drawing is conceptual, and the relative size relationship between members is not limited thereto.

Herein, the term "process" includes, in addition to a process independent from other processes, a process which is not clearly distinguished from other processes but whose purpose is achieved.

Herein, numerical ranges indicated using "to" include numerical values described before and after "to" as the minimum value and the maximum value, respectively.

Within stepwise numerical ranges described herein, the upper limit value or the lower limit value described in one numerical range may be replaced with the upper limit value or the lower limit value of another stepwise numerical range. In the numerical range described herein, the upper limit value or the lower limit value of the numerical value range may be replaced with values illustrated in Examples.

Herein, each component may contain a plurality of corresponding substances.

Herein, the term "layer" or "film" includes, when observing a region where a layer or film is present, a case in which the layer or the film is formed only on a part of the region in addition to a case in which the layer or the film is formed on the entirety of the region.

The term "stack (multi-layer)" as used herein refers to stacking of layers, and two or more layers may be bonded, and two or more layers may be removable.

<Semiconductor Element Mounting Structure>

A first semiconductor element mounting structure of the present disclosure is a semiconductor element mounting structure, including: a semiconductor element including an element electrode, and a substrate including a substrate electrode that is provided on a surface facing the semiconductor element at a position facing the element electrode, the semiconductor element and the substrate being connected via the element electrode and the substrate electrode, in which: one of the element electrode or the substrate electrode is a first protruding electrode including a solder layer at a tip portion thereof, the other of the element electrode or the substrate electrode is a first electrode pad including one or more metal protrusions on a surface thereof, the one or more metal protrusions of the first electrode pad extend into the solder layer of the first protruding electrode, and a bottom area of each of the one or more metal protrusions of the first electrode pad is 75% or less with respect to a maximum cross-sectional area of the solder layer of the first protruding electrode.

A second semiconductor element mounting structure of the present disclosure is a semiconductor element mounting structure, including: a semiconductor element including an element electrode, and a substrate including a substrate electrode that is provided on a surface facing the semiconductor element at a position facing the element electrode, the semiconductor element and the substrate being connected via the element electrode and the substrate electrode, in which: one of the element electrode or the substrate electrode is a first protruding electrode including a solder layer at a tip portion thereof, the other of the element electrode or the substrate electrode is a first electrode pad including one or more metal protrusions on a surface thereof, the one or more metal protrusions of the first electrode pad extend into the solder layer of the first protruding electrode, and a bottom area of each of the one or more metal protrusions of the first electrode pad is 70% or less with respect to an area of the first electrode pad.

Herein, the first semiconductor element mounting structure and the second semiconductor element mounting structure may be collectively referred to as a "semiconductor element mounting structure".

Herein, the first protruding electrode and the first electrode pad constitute an element electrode or a substrate electrode that contributes to connection between a semiconductor element and a substrate. A second protruding electrode and a second electrode pad, which will be described later, constitute an element electrode that contributes to connection between semiconductor elements. Herein, the first protruding electrode and the second protruding electrode may be collectively simply referred to as a protruding electrode hereinafter. The first electrode pad and the second electrode pad may be collectively simply referred to as an electrode pad.

According to the semiconductor element mounting structure of the present disclosure, a semiconductor element mounting structure having excellent connection accuracy between a semiconductor element and a substrate can be obtained. The reason is not clear, but is presumed as follows.

In the semiconductor element mounting structure of the present disclosure, a semiconductor element and a substrate are connected via an element electrode and a substrate electrode. Here, one of the element electrode or the substrate electrode is a protruding electrode including a solder layer at a tip portion thereof, and the other of the element electrode or the substrate electrode is an electrode pad including one or more metal protrusions on a surface thereof. When a semiconductor element is connected to a substrate, the semiconductor element is subjected to a heating process such as reflow after being temporarily mounted on the substrate. When the semiconductor element is temporarily mounted on the substrate, the metal protrusion is pressed against the solder layer, and therefore, at least a part of a tip portion of the protrusion extends into the solder layer. Since solder has a lower melting temperature and lower hardness than other metal materials, the at least a part of a tip portion of the protrusion easily extends into the solder layer. Since the at least a part of a tip portion of the metal protrusion extends into the solder layer, the semiconductor element temporarily mounted on the substrate is easily temporarily fixed on the substrate. For this reason, when handling the substrate on which the semiconductor element is temporarily mounted, the temporarily mounted semiconductor element is less likely to come off the substrate due to vibrations in a heating process such as reflow, and the semiconductor element is less likely to be misaligned. Accordingly, it is presumed that the semiconductor element mounting structure of the present disclosure has excellent connection accuracy between a semiconductor element and a substrate. The semiconductor element mounting structure according to the present disclosure is particularly effective for a semiconductor element mounting structure including a connecting portion with a reduced pitch.

Herein, the term "connection" means that a semiconductor element and a substrate, or semiconductor elements are physically connected to each other via an electrode (that is, an element electrode or a substrate electrode).

The method for connecting a semiconductor element and a substrate is not particularly limited. Examples of such a method include a method in which the semiconductor element and the substrate are temporarily fixed in a state in which at least a portion of the one or more metal protrusions of the first electrode pad is extended into the solder layer of the first protruding electrode by pressurization, and the solder layer of the first protruding electrode is melted by heating to connect the element electrode and the substrate electrode, from the viewpoint of production efficiency.

More specifically, the protruding electrode and the electrode pad are aligned, and pressure is applied in a state in which the solder layer at a tip portion of the protruding electrode and the one or more metal protrusions on a surface of the electrode pad are in contact. As a result, a top of the metal protrusion of the electrode pad extends into the solder layer of the protruding electrode, and the semiconductor element is temporarily mounted on the substrate. Then, using a heating device represented by reflow, solder constituting the solder layer is melted, and the protruding electrode and the electrode pad can be connected by soldering.

When the semiconductor element is temporarily mounted on the substrate, a flux may be applied onto at least one of the protruding electrode or the electrode pad in order to improve the solder wettability and secure connection.

The pressure applied when the solder layer and the metal protrusion are pressed in contact with each other is not particularly limited. As in the case of a general flip chip mounting process, the pressure may be set in consideration of the number of protruding electrode, variation in the height of protruding electrode, the amount of deformation of protruding electrode or wiring on a substrate due to pressurization, or the like. Specifically, for example, it is preferable to set the pressure in such a manner that a load received per one protruding electrode is about from 1 gf (0.0098 N) to 20 gf (0.196 N). For example, it is preferable to set the pressure in such a manner that a load applied to one semiconductor element is about from 5N to 200N.

When a load received per one protruding electrode is 0.0098 N or more, or a load applied to a semiconductor element is 5 N or more, the temporary fixing force of the semiconductor element is sufficient, and the semiconductor element tends to be less likely to be misaligned in a subsequent process. When a load received per one protruding electrode is 0.196 N or less, or a load applied to a semiconductor element is 200 N or less, occurrence of damage to the semiconductor element due to an excessively large load tends to be suppressed.

When pressure is applied in a state in which the solder layer and the metal protrusion are in contact with each other, at least one of the substrate or the semiconductor element may be heated. From the viewpoint of productivity and handleability when a semiconductor element is transferred by a transfer device, the heating is preferably performed at a temperature at which the solder does not melt, and is preferably performed at a temperature of 210° C. or lower, and more preferably performed at a temperature of 200° C. or less.

The kind of semiconductor element is not particularly limited, and examples thereof include an elemental semiconductor composed of the same kind of element such as silicon or germanium, and a compound semiconductor such as gallium arsenide or indium phosphide. Other examples include a chip (die) itself that is not packaged with a resin or the like, a CSP that is packaged with a resin or the like, and a semiconductor package that is called a Ball Grid Array (BGA) or the like. The semiconductor element may have a configuration in which a plurality of semiconductor elements are arranged in at least one of a height direction or a planar direction. When a plurality of semiconductor elements are arranged in the height direction, the plurality of semiconductor elements may be connected by TSV.

The protruding electrode is not particularly limited, as long as the electrode includes a solder layer at a tip portion thereof. The protruding electrode may be a combination of a metal post and a solder layer that is provided at a tip portion of the metal post. The material of protruding electrode including a solder layer is not particularly limited, as long as the material includes solder, and can be selected from commonly used materials.

An interval between the protruding electrodes is preferably from 1 μm to 100 μm, more preferably from 10 μm to 70 μm, and still more preferably from 30 μm to 50 μm.

A thickness of the solder layer is preferably from 0.1 μm to 50 μm, more preferably from 1 μm to 30 μm, and still more preferably from 5 μm to 20 μm. When the thickness of the solder layer is 0.1 μm or more, an amount of extension of the metal protrusion into the solder layer can be sufficiently ensured, and the temporary fixing force is unlikely to be small, and therefore, there is a tendency that misalignment in a subsequent process is unlikely to occur. When the thickness of the solder layer is 50 μm or less, the processing time for melting the solder layer to connect the element electrode and the substrate electrode tends to be less prolonged. In this case, when connecting the element electrode and the substrate electrode, an electrical short circuit between adjacent electrodes is less likely to occur.

When the protruding electrode has a configuration including a metal post and a solder layer that is provided at a tip portion of the metal post, the metal post including a metal layer mainly composed of gold, silver, copper, tin, nickel, or the like may be formed, for example, by plating. The metal layer constituting the metal post may include a single component or may include a plurality of components. The metal layer may have a single-layer structure, or a multi-layer structure in which a plurality of metal layers are layered. As a material of the metal post, copper can be preferably used because of a low electric resistance and relatively high corrosion resistance.

As a solder material for the solder layer, tin-silver solder, tin-lead solder, tin-bismuth solder, tin-copper solder, gold-copper solder, tin-silver-copper solder, or the like can be used, and a lead-free solder such as gold-copper solder, tin-copper solder, tin-bismuth solder, tin-silver solder, or tin-silver-copper solder can be preferably used from the viewpoint of environmental issues and safety.

When forming a solder layer on a copper metal post, from the viewpoint of improving connection reliability, a nickel layer may be formed between the copper metal post and the solder layer in order to suppress diffusion between metal components. After a solder layer is formed on a protruding electrode by plating, printing, or the like, it is not necessary to perform a heat treatment on the solder layer so that the metal protrusion of an electrode pad can easily extend into the solder layer.

The kind of substrate is not particularly limited, and examples thereof include a wiring board in which conductor wiring including an electrode for connection is formed on:

an organic substrate including a fiber base material such as FR4 or FR5; a built-up type organic substrate without a fiber base material; an organic film such as polyimide or polyester; or a base material including an inorganic material such as alumina, glass, or silicon. A circuit, a substrate electrode, or the like may be formed on the substrate by a method such as a semi-additive method or a subtractive method.

The substrate may be silicon (Si). A size, a thickness, or the like of the silicon (Si) substrate is not limited. Examples of the silicon (Si) substrate include a wafer having a surface on which conductor wiring including an electrode for cocnnection is formed. Wiring, transistors, other electronic elements, through silicon vias (TSV), or the like may be formed on the silicon (Si) substrate.

Each of the one or more metal protrusions may be photolithographically formed.

When forming a metal protrusion on the surface of an electrode pad using photolithography technique, the metal protrusion may be formed through a process of carrying out application of a photosensitive photoresist onto the electrode pad surface on which a seed layer is left, exposure, development, plating, stripping of the photoresist, and etching of the seed layer. A method of forming the metal protrusion is not limited to the above-described method.

As the method of forming a metal protrusion, a method of welding a metal wire such as gold, copper, or the like on an electrode pad using a ball bonder, forming into a columnar shape, and cutting the column at a specific length; a method of forming using a 3D printer; a method of forming by cutting, or the like can be used in addition to the method of forming a metal protrusion using photolithography.

A material of the metal protrusion is not particularly limited, and various metals such as copper or nickel may be used. When copper is used as a material of the metal protrusion, a semiconductor element mounting structure including a connecting portion having a heat dissipation effect and a low connection resistance can be obtained.

In order to ensure connection between electrodes, a surface of the metal protrusion may be subjected to gold plating, nickel/gold plating, Organic Solderability Preservative (OSP) treatment, or the like. Commercially available products of OSP include heat-resistant water-soluble preflux Toughace F2 (LX) PK manufactured by SHIKOKU CHEMICALS CORPORATION.

A shape of the metal protrusion is not particularly limited. Examples of the shape of the metal protrusion include a cylindrical column, a rectangular parallelepiped, and a triangular prism.

When the shape of the metal protrusion is a cylindrical column or a rectangular parallelepiped, a top of the metal protrusion and a solder layer at a tip portion of the protruding electrode that has been plastically deformed by extension of the top of the metal protrusion are favorably engaged with each other. For this reason, sufficient strength can be obtained with respect to also an external force at the time of a reflow process, and there is a tendency that occurrence of misalignment of a connecting portion can be further suppressed.

The metal protrusion may have a shape in which at least two cylindrical columns, rectangular parallelepipeds, triangular prisms, or the like are stacked in a height direction. In this case, it is preferable that the bottom surface area of a cylindrical column, rectangular parallelepiped, triangular prism, or the like that is provided farthest from the surface of an electrode pad is smaller than the bottom surface area of a cylindrical column, rectangular parallelepiped, triangular prism, or the like that is provided nearest to the surface of the electrode pad. As a result, a top of the metal protrusion easily extends into the solder layer of the protruding electrode, and the metal protrusion and the solder layer of the protruding electrode are favorably engaged with each other, the strength against external force during a reflow process is increased, and misalignment is less likely to occur.

The shape of the metal protrusion is preferably a cylindrical column or a rectangular parallelepiped because of easy extension into a solder layer.

The metal protrusion may have a shape in which at least two cylindrical columns or rectangular parallelepipeds are stacked in a height direction.

The electrode pad may include two or more metal protrusions on a surface. When two or more metal protrusions are provided on the surface, a shape of each metal protrusion may be the same as or different from each other.

It is desirable that a height of the metal protrusion in the electrode pad is equal to or less than the thickness of the solder layer of a protruding electrode. By setting the height of the metal protrusion to be equal to or less than the thickness of the solder layer, the metal protrusion easily extends into the solder layer. When a metal protrusion extends as deeply into a solder layer as possible, the strength can be increased, and there is a tendency that misalignment of a connecting portion can be suppressed. The height of the metal protrusion is not particularly limited, and from the viewpoint that the amount of extension of a metal protrusion into a solder layer can be increased and from the viewpoint of industrial productivity, the height is preferably from 0.1 µm to 50 µm, more preferably from 0.5 µm to 30 µm, and still more preferably from 1 µm to 10 µm. In order to improve the solder wettability when forming connection between the metal protrusion and the protruding electrode by solder melting, a gold-containing layer that contains gold as a main component may be formed on the outermost surface of the metal protrusion. The method of forming a gold-containing layer is not particularly limited, and a method such as plating or sputtering may be used.

In the first semiconductor element mounting structure of the present disclosure, in order to have a metal protrusion of an electrode pad extended into a solder layer of a protruding electrode, a bottom area of the metal protrusion, with respect to a maximum cross-sectional area of the solder layer of the protruding electrode, is 75% or less, preferably 70% or less, more preferably 50% or less, and still more preferably 40% or less. When the bottom area of the metal protrusion is 75% or less with respect to the maximum cross-sectional area of the solder layer of the protruding electrode, the metal protrusion can easily extends into the solder layer of the protruding electrode, and misalignment of a connecting portion is suppressed. From the viewpoint of preventing a metal protrusion from breaking or falling when the metal protrusion extends into the solder layer of a protruding electrode, the bottom area of the metal protrusion, with respect to the maximum cross-sectional area of the solder layer of the protruding electrode, is preferably 5% or more, and more preferably 10% or more. Herein, the maximum cross-sectional area of the solder layer refers to an area of the solder layer when the protruding electrode is viewed from a height direction.

In the second semiconductor element mounting structure of the present disclosure, in order to have a metal protrusion of an electrode pad extended into a solder layer of a protruding electrode, a bottom area of the metal protrusion, with respect to an area of the electrode pad, is 70% or less, preferably 50% or less, and more preferably 40% or less. When the bottom area of the metal protrusion is 70% or less with respect to the area of the electrode pad, the metal protrusion easily extends into the solder layer of the protruding electrode, and misalignment of a connecting portion is suppressed. The bottom area of the metal protrusion, with respect to the area of the electrode pad, may be 5% or more, or 10% or more.

The bottom area of the metal protrusion refers to an area occupied by the metal protrusion when the metal protrusion is observed from a height direction. When the metal protrusion has a shape in which cylindrical columns, rectangular parallelepipeds, triangular prisms, or the like are stacked in a height direction, the bottom area of the metal protrusion refers to a bottom area of a cylindrical column, rectangular parallelepiped, triangular prism, or the like that is provided at the bottom. When the electrode pad includes two or more metal protrusions on a surface thereof, a bottom area of the metal protrusion refers to the sum of the bottom area of each metal protrusion.

In the second semiconductor element mounting structure of the present disclosure, a bottom area of the metal protrusion with respect to an area of the solder layer when the protruding electrode is viewed from a height direction (the maximum cross-sectional area of the solder layer) may be 75% or less, 70% or less, 50% or less, or 40% or less. The bottom area of the metal protrusion with respect to the area of the solder layer when the protruding electrode is viewed from a height direction may be 5% or more, 10% or more, or 15% or more.

In the semiconductor element mounting structure of the present disclosure, at an opposite side of the semiconductor element from the side facing the substrate, one or more further semiconductor elements may be layered in a state such that each semiconductor element is connected via an element electrode. When a plurality of semiconductor elements are layered, in two of the further semiconductor elements that are disposed in a connected relationship, one of an element electrode of one further semiconductor element or an element electrode of the other further semiconductor element may be a second protruding electrode including a solder layer at a tip portion thereof, the other of the element electrode of the one further semiconductor element or the element electrode of the other further semiconductor element may be a second electrode pad including one or more metal protrusions on a surface thereof, the one or more metal protrusions of the second electrode pad may extend into the solder layer of the second protruding electrode, and a bottom area of each of the one or more metal protrusions of the second electrode pad may be 75% or less with respect to a maximum cross-sectional area of the solder layer of the second protruding electrode, or a bottom area of each of the one or more metal protrusions of the second electrode pad may be 70% or less with respect to an area of the second electrode pad.

The bottom area of the metal protrusion of the second electrode pad with respect to the maximum cross-sectional area of the solder layer of the second protruding electrode including a solder layer at a tip portion thereof may be 70% or less, 50% or less, or 40% or less. On the other hand, the bottom area of the metal protrusion of the second electrode pad with respect to the maximum cross-sectional area of the solder layer of the second protruding electrode including a solder layer at a tip portion thereof may be 5% or more, 10% or more, or 15% or more.

The bottom area of the metal protrusion of the second electrode pad, with respect to the area of the second electrode pad, may be 50% or less, or 40% or less. On the other hand, the bottom area of the metal protrusion of the second electrode pad, with respect to the area of the second electrode pad, may be 5% or more, 10% or more, or 15% or more.

The details of the protruding electrode and the electrode pad when a plurality of semiconductor elements are layered and the details of the method for connecting the protruding electrode and the electrode pad are as described above.

Next, a specific example of a semiconductor element mounting structure and a method of manufacturing the same according to the present disclosure will be described with reference to the drawings. However, the present invention is not limited to these embodiments. Each of the drawings illustrates a main part near a connecting portion between a protruding electrode and a metal protrusion of an electrode pad.

Figure 1B:
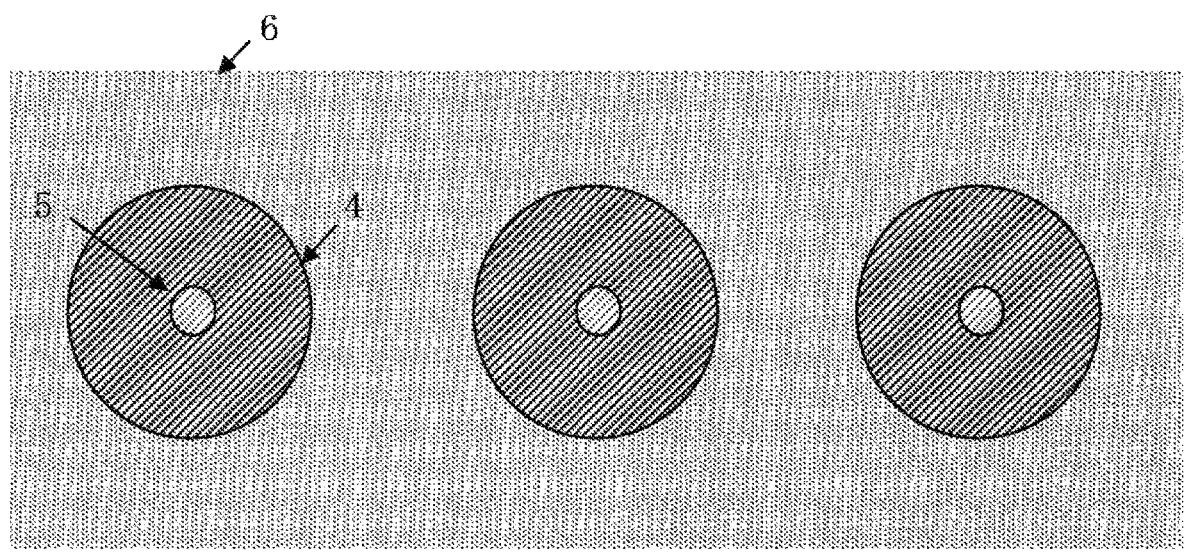
FIG. 1B is a plan view showing a state before a semiconductor element and a substrate are connected.
Figure 2:
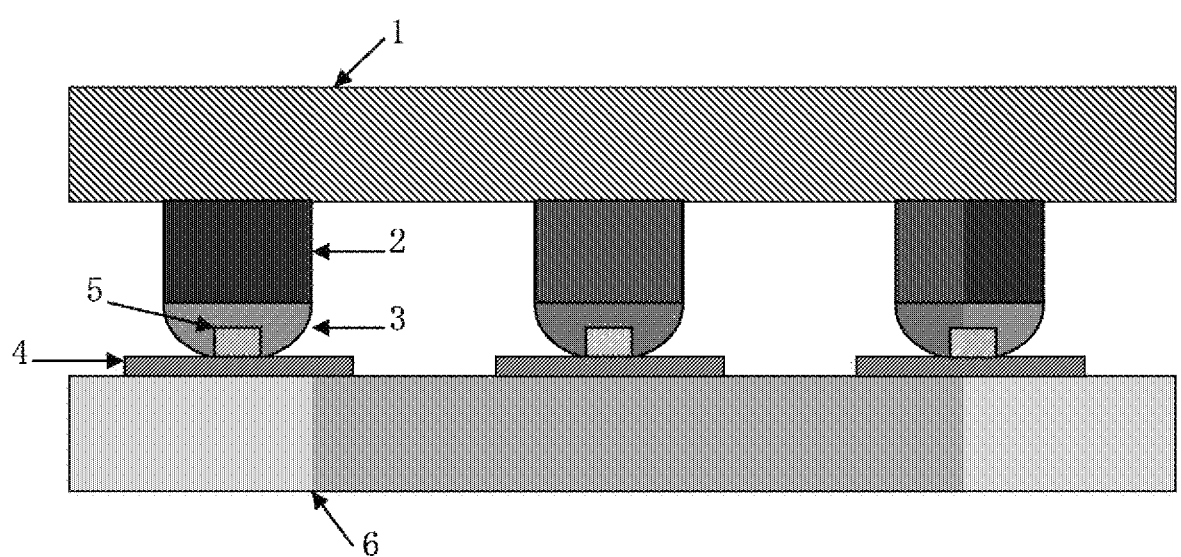
FIG. 2 is a sectional view of a main part showing a state in which a semiconductor element is temporarily mounted on a substrate.
Figure 3:
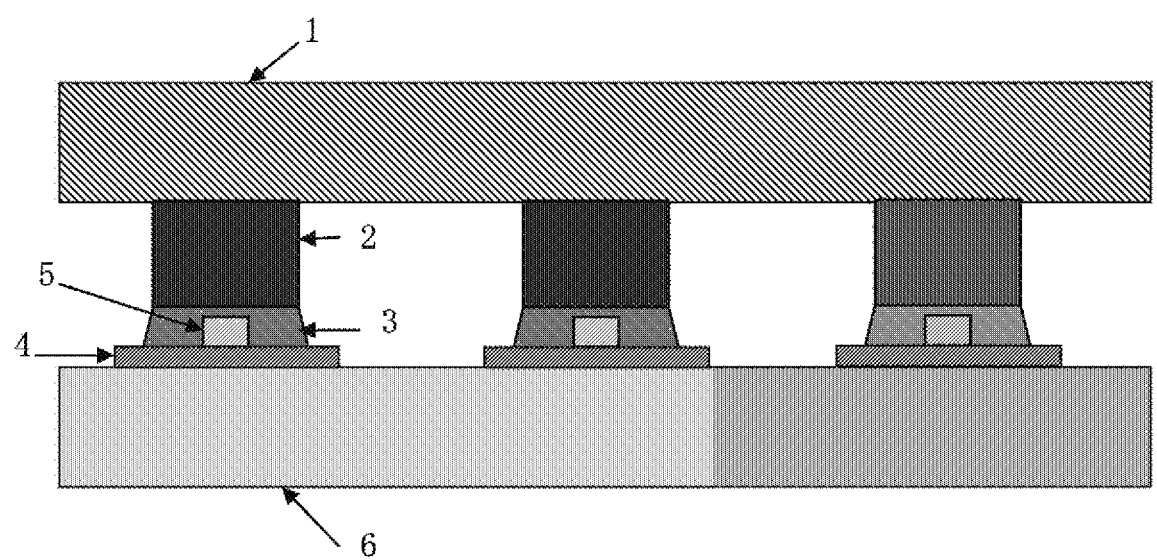
FIG. 3 is a sectional view of a main part showing a state after a semiconductor element and a substrate are connected.

FIG. 1A is a sectional view of a main part showing a state before a semiconductor element and a substrate are connected. FIG. 1B is a plan view showing a state of a substrate before a semiconductor element and a substrate are connected. FIG. 2 is a sectional view of a main part showing a state in which a semiconductor element is temporarily mounted on a substrate. FIG. 3 is a sectional view of a main part showing a state after a semiconductor element and a substrate are connected. In the following drawings, a configuration in which the element electrode is a protruding electrode and the substrate electrode is an electrode pad will be described, but the present disclosure is not limited thereto, and may have a configuration in which the element electrode is an electrode pad and the substrate electrode is a protruding electrode.

In FIG. 1A, FIG. 1B, FIG. 2, and FIG. 3, reference numeral 1 denotes a semiconductor element including an electrode pad (not illustrated), reference numeral 2 denotes a metal post (pillar) made of metal such as copper formed on an electrode pad on an element surface of the semiconductor element 1, and reference numeral 3 denotes a solder layer that is provided at a tip portion of the metal post 2. In FIG. 1A, a protruding electrode is formed by the metal post 2 and the solder layer 3. Reference numeral 6 denotes a substrate, reference numeral 4 denotes an electrode pad that is formed at a position facing a protruding electrode on the surface of the substrate 6, and reference numeral 5 denotes a metal protrusion that is provided on the surface of the electrode pad 4. A protruding electrode is formed on the element surface of a semiconductor element, and the electrode pad 4 is formed on the surface of the substrate 6 at a position facing the protruding electrode.

First, as shown in FIG. 1A, a protruding electrode of the semiconductor element 1 is aligned with the metal protrusion 5 provided on the electrode pad 4 facing the protruding electrode. Next, as shown in FIG. 2, pressure is applied in a state in which the protruding electrode and the electrode pad 4 that includes the metal protrusion 5 face each other, and the metal protrusion 5 of the electrode pad 4 is extended into the solder layer 3 of the protruding electrode to achieve temporal mounting.

Thereafter, in a state in which the semiconductor element 1 is temporarily mounted on the substrate 6, the solder layer 3 is melted using a heating device represented by reflow, and a protruding electrode (element electrode) of the semiconductor element 1 and the electrode pad 4 (substrate electrode) of the substrate 6 that includes the metal protrusion 5 are connected by solder. Through the above steps, a semiconductor element mounting structure in which the metal protrusion 5 extends into the solder layer 3 as shown in FIG. 3 is manufactured.

After the solder connection is completed, sealing may be performed to fill a space between the semiconductor element and the substrate with a resin material. By using an appropriate sealing resin material depending on the structure of a product, the use environment, and the like, the reliability of operation in the use environment of the product may be improved. The method of resin sealing is not limited, and a capillary flow underfill method in which a liquid resin material is poured between a semiconductor element and a substrate, a mold underfill method in which a liquid resin, a molten granular resin, or the like is poured in a molding process, or the like can be used. As the liquid resin, a resin to which particles made of an inorganic material such as silica, alumina, silicon nitride, or boron nitride, particles made of an organic material, or the like are added may be used. When particles made of such as alumina, silicon nitride, or boron nitride are used, the thermal conductivity of a resin material tends to be increased, and when a semiconductor element with high heat generation rate is used, the heat radiation characteristics can be improved, and the operation stability of a semiconductor tends to be improved.

Figure 4:
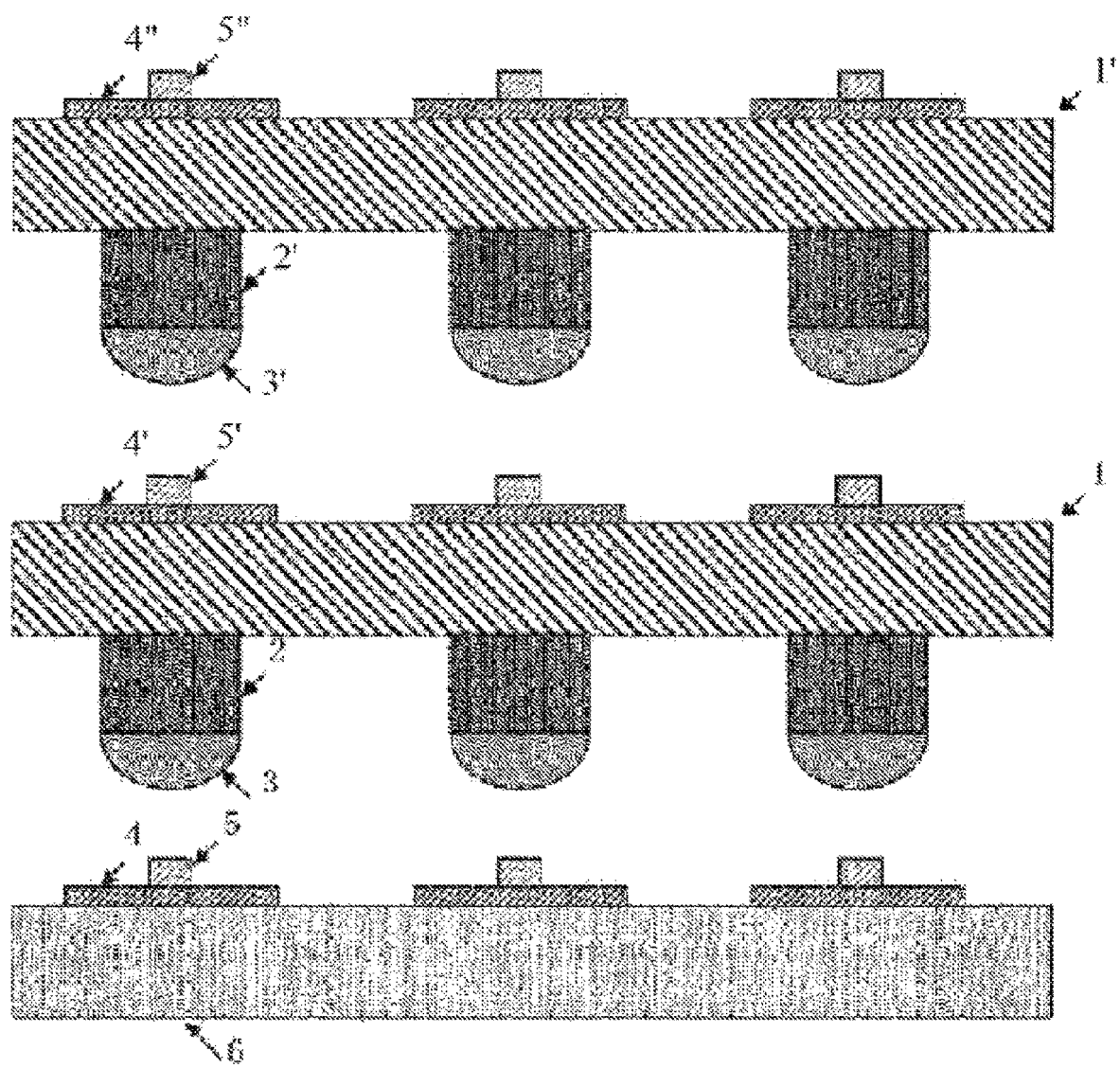
FIG. 4 is a sectional view of a main part showing a state before a semiconductor element, a further semiconductor element and a substrate are connected.

FIG. 4 shows a semiconductor element mounting structure in which, at an opposite side of the semiconductor element 1 from the side facing the substrate 6, one or more further semiconductor elements 1' are layered in a state such that each semiconductor element is connected via an element electrode. The semiconductor element 1 is configured to further have an electrode pad 4' and a metal protrusion 5' at an opposite side of the semiconductor element 1 from the side that is provided with the metal post 2 and the solder layer 3. The semiconductor element 1' is configured, in the same manner as the semiconductor element 1, to have a metal post 2' and a solder layer 3', as well as an electrode pad 4" and a metal protrusion 5". The semiconductor elements 1, 1' are disposed in a connected relationship. In the case of FIG. 4, an element electrode of the semiconductor element 1' is a second protruding electrode 2' including the solder layer 3' at a tip portion thereof, and an element electrode of the semiconductor element 1 is a second electrode pad 4' including one or more metal protrusions 5' on a surface thereof. In a similar manner as shown in FIG. 2, the one or more metal protrusions 5' of the second electrode pad 4' would extend into the solder layer 3' of the second protruding electrode 2'.

Figure 5A:
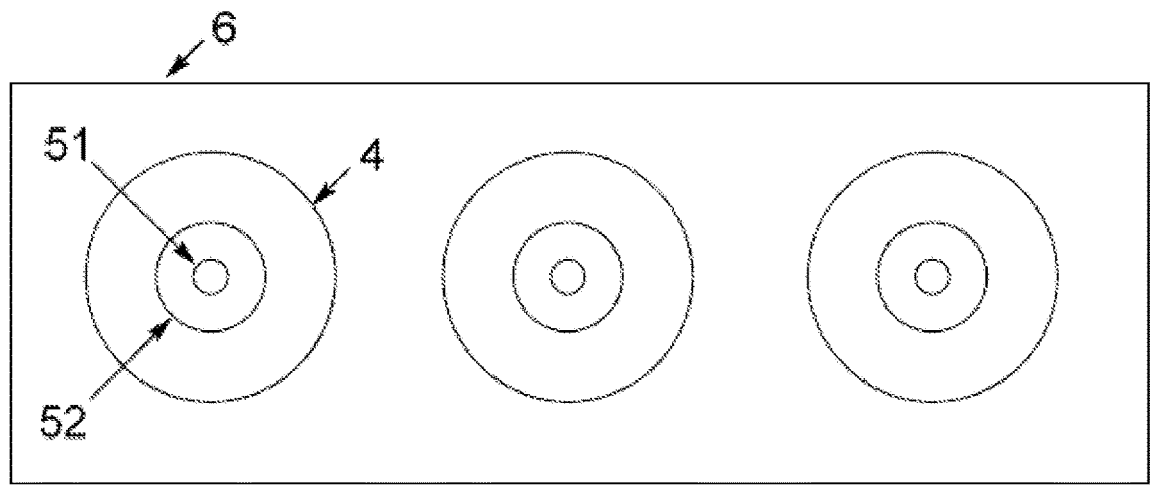
FIGS. 5A and 5B are plan views showing a state before a semiconductor element and a substrate are connected.
Figure 5B:
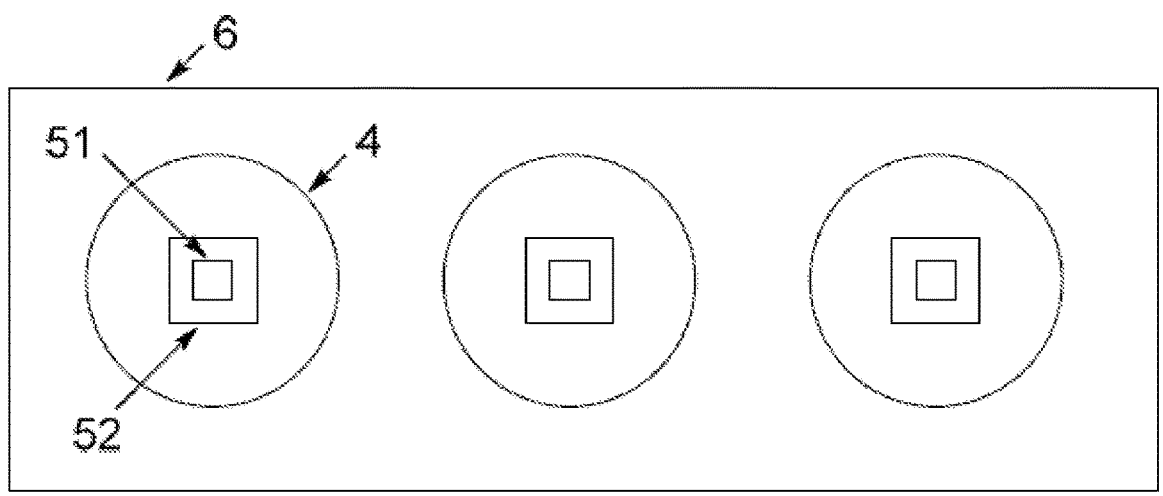

FIGS. 5A and 5B are plan views of alternative embodiments to that of FIG. 1B showing a state before a semiconductor element and a substrate are connected. In FIG. 5A, a case is exemplified in which each of the one or more metal protrusions 51, 52 has a shape in which two cylindrical columns are stacked in a height direction. In FIG. 5B, a case is exemplified in which each of the one or more metal protrusions 51, 52 has a shape in which two rectangular parallelepipeds are stacked in a height direction.

<Combination of Semiconductor Element and Substrate>

A first combination of a semiconductor element and a substrate of the present disclosure is a combination of a semiconductor element and a substrate, including: a semiconductor element including an element electrode, and a substrate including a substrate electrode that is provided on a surface facing the semiconductor element at a position facing the element electrode, in which: one of the element electrode or the substrate electrode is a protruding electrode including a solder layer at a tip portion thereof, the other of the element electrode or the substrate electrode is an electrode pad including one or more metal protrusions on a surface thereof, and a bottom area of each of the one or more metal protrusions is 75% or less with respect to a maximum cross-sectional area of the solder layer of the protruding electrode.

A second combination of a semiconductor element and a substrate of the present disclosure is a combination of a semiconductor element and a substrate, including: a semiconductor element including an element electrode, and a substrate including a substrate electrode that is provided on a surface facing the semiconductor element at a position facing the element electrode, in which: one of the element electrode or the substrate electrode is a protruding electrode including a solder layer at a tip portion thereof, the other of the element electrode or the substrate electrode is an electrode pad including one or more metal protrusions on a surface thereof, and a bottom area of each of the one or more metal protrusions is 70% or less with respect to an area of the electrode pad.

Herein, the first combination of a semiconductor element and a substrate, and the second combination of a semiconductor element and a substrate may be collectively referred to as a "combination of a semiconductor element and a substrate".

The semiconductor element mounting structure of the present disclosure may be manufactured by using the combination of a semiconductor element and a substrate according to the present disclosure.

The details of the semiconductor element, the substrate, the electrode pad, the protruding electrode, and the like included in the combination of a semiconductor element and a substrate according to the present disclosure are the same as the case of the semiconductor element mounting structure according to the present disclosure.

The description above is merely an example of embodiments of the present disclosure, and the present disclosure is not limited thereto, and various modifications and improvements may be carried out without departing from the gist of the present disclosure.

EXAMPLES

Hereinafter, the present invention will be more specifically described with reference to Examples, but the present invention is not limited to Examples.

Example 1

A silicon chip (WALTS CO., LTD., trade name "WALTS-TEG WM40-0102JY", protruding electrode (bump): Sn—Ag solder, bump solder thickness: 8 μm, bump interval: 40 μm, copper pillar height: 15 μm, bump size: φ20 μm) having a size of 10 mm×8 mm and a thickness of 725 μm including aluminum wiring was prepared as a semiconductor element.

An electrode pad was formed on a silicon wafer with plated copper having a diameter of 26 μm and a thickness of 2 μm at a position facing the bump position of "WALTS-TEG WM40-0102JY" using a semi-additive process. At this time, a seed layer was not etched. Next, a metal protrusion having a length of 20 μm, a width of 3 μm, and a height of 5 μm was formed on the surface of the prepared electrode pad similarly by using a semi-additive process, and eventually, the seed layer of the electrode pad was etched to prepare an electrode pad including a metal protrusion. This was diced into a size of 10 mm×8 mm to prepare a substrate, which was used for evaluation.

Next, a side of the silicon chip on which the bump was formed was directed toward the substrate, and the silicon chip was pressed by a pressing member with a load of 100

N from above the silicon chip in such a manner that the bump came into contact with the substrate, thereby having the metal protrusion on the substrate extended into a solder layer of the bump. At this time, pressure was applied after applying flux onto the bump of the silicon chip. A substrate on which the silicon chip (semiconductor element) was temporarily mounted was thus manufactured.

The substrate on which the silicon chip was temporarily mounted was passed through an IR reflow furnace (TAMURA Corporation, trade name "TNP225-337EM") to melt the solder, and the bump of the silicon chip was connected to the substrate by soldering. The temperature profile was set in such a manner that a maximum heating temperature in the IR reflow furnace was 260° C.

Example 2

An electrode pad was formed on a silicon wafer with plated copper having a diameter of 26 µm and a thickness of 2 µm at a position facing the bump position of "WALTS-TEG WM40-0102JY" using a semi-additive process. At this time, a seed layer was not etched. Next, two metal protrusions each having a length of 20 µm, a width of 3 µm, and a height of 5 µm were formed on the surface of the prepared electrode pad similarly by using a semi-additive process, and eventually, the seed layer of the electrode pad was etched to prepare an electrode pad including metal protrusions. This was diced into a size of 10 mm×8 mm and used for evaluation, and the other conditions were the same as in Example 1.

Example 3

An electrode pad was formed on a silicon wafer with plated copper having a diameter of 26 µm and a thickness of 2 µm at a position facing the bump position of "WALTS-TEG WM40-0102JY" using a semi-additive process. At this time, a seed layer was not etched. Next, a metal protrusion having a length of 10 µm, a width of 10 µm, and a height of 5 µm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

Example 4

An electrode pad was formed on a silicon wafer with plated copper having a diameter of 26 µm and a thickness of 2 µm at a position facing the bump position of "WALTS-TEG WM40-0102JY" using a semi-additive process. At this time, a seed layer was not etched. Next, a metal protrusion having a diameter of 16 µm and a height of 5 µm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

Example 5

An electrode pad was formed on a silicon wafer with plated copper having a diameter of 26 µm and a thickness of 2 µm at a position facing the bump position of "WALTS-TEG WM40-0102JY" using a semi-additive process. At this time, a seed layer was not etched. Next, a metal protrusion having a diameter of 16 µm and a height of 2 µm was formed on the surface of the prepared electrode pad similarly by using a semi-additive process. A metal protrusion having a diameter of 8 µm and a height of 3 µm was formed on the upper surface of the prepared cylindrical metal protrusion similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

Comparative Example 1

No metal protrusion was formed on the surface of the electrode pad of Example 1, and the other conditions were the same as in Example 1.

Comparative Example 2

An electrode pad was formed on a silicon wafer with plated copper having a diameter of 26 µm and a thickness of 2 µm at a position facing the bump position of "WALTS-TEG WM40-0102JY" using a semi-additive process. At this time, a seed layer was not etched. Next, a metal protrusion having a diameter of 24 µm and a height of 5 µm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

Comparative Example 3

An electrode pad was formed on a silicon wafer with plated copper having a diameter of 26 µm and a thickness of 2 µm at a position facing the bump position of "WALTS-TEG WM40-0102JY" using a semi-additive process. At this time, a seed layer was not etched. Next, a metal protrusion having a diameter of 22 µm and a height of 5 µm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

With respect to the above-obtained semiconductor element mounting structure, misalignment after mounting was confirmed as follows. Table 1 shows evaluation results.

<Confirmation of Misalignment Between Silicon Chip and Substrate>

Misalignment was confirmed for a semiconductor element mounting structure in which a metal protrusion of a substrate was extended into a solder bump of a silicon chip such that the silicon chip was temporarily mounted on the substrate, and solder connection was performed by a heat treatment, by confirming misalignment between the solder bump of the silicon chip and the electrode pad of the substrate with an X-ray inspection system (Japan Nordson Advanced Technology K.K., trade name "XD-7600NT100-CT"). Misalignment was evaluated according to the following evaluation criteria.

Misalignment was determined by performing measurement at five points, from which the arithmetic average value was obtained.

—Evaluation Criteria—

A: The average of the misalignment between the bump of the silicon chip and the electrode pad of the substrate was less than 10 μm.

B: The average of the misalignment between the bump of the silicon chip and the electrode pad of the substrate was 10 μm or more and less than 15 μm.

C: The average of the misalignment between the bump of the silicon chip and the electrode pad of the substrate was 15 μm or more.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| Shape of metal protrusion | Rectangular parallelepiped | Rectangular parallelepiped × 2 | Rectangular parallelepiped | Cylindrical column | Two layers of cylindrical columns | — | Cylindrical column | Cylindrical column |
| Bottom area of metal protrusion (μm²) | 60 | 120 | 100 | 201 | 201 | — | 452 | 380 |
| Area of electrode pad (μm²) | 531 | 531 | 531 | 531 | 531 | 531 | 531 | 531 |
| Area ratio of metal protrusion/ electrode pad (%) | 11 | 23 | 19 | 38 | 38 | — | 85 | 72 |
| Confirmation result of misalignment | A | A | A | A | A | C | C | B |

Example 6

A layerable silicon chip (WALTS CO., LTD., trade name "WALTS-TEG WM40-0101JY", protruding electrode (bump): Sn—Ag solder, bump solder thickness: 8 μm, bump interval: 40 μm, copper pillar height: 15 μm, bump size: φ20 μm, electrode pad: pad size: φ26 μm, pad height: 6 μm) having a size of 10 mm×8 mm and a thickness of 50 μm including aluminum wiring, in which the electrode pad was provided at the same position on a surface opposite to the protruding electrode, was prepared as a semiconductor element. A metal protrusion having a length of 20 μm, a width of 3 μm, and a height of 5 μm was formed on the electrode pad of "WALTS-TEG WM40-0101JY" in the same manner as in Example 1, and the resulting product was used for evaluation.

Next, a side of the silicon chip on which the bump was formed was directed toward the substrate, and the silicon chip was pressed by a pressing member with a load of 100 N from above the silicon chip in such a manner that the bump came into contact with the substrate, thereby having the metal protrusion on the substrate extended into a solder layer of the bump. At this time, pressure was applied after applying flux onto the bump of the silicon chip. Similarly, the same silicon chip was layered in four layers under the same conditions, to prepare a substrate on which four layers of silicon chips (semiconductor elements) were temporarily mounted, and the other conditions were the same as in Example 1.

Example 7

A liquid sealant: CEL-C-3730 manufactured by Hitachi Chemical Co., Ltd. was applied, using a jet dispenser (Musashi Engineering, Inc., trade name "FAD2500"), onto a substrate that had been soldered and connected by passing the substrate on which a silicon chip was temporarily mounted through an IR reflow furnace and, cured at 165° C. for 2 hours in Example 1. The other conditions were the same as in Example 1.

Example 8

An electrode pad was formed on a silicon wafer with plated copper having a diameter of 26 μm and a thickness of 2 μm at a position facing the bump position of "WALTS-TEG WM40-0102JY" using a semi-additive process. At this time, a seed layer was not etched. Next, a metal protrusion having a diameter of 16.4 μm and a height of 5 μm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

Example 9

An electrode pad was formed on a silicon wafer with plated copper having a diameter of 26 μm and a thickness of 2 μm at a position facing the bump position of "WALTS-TEG WM40-0102JY" using a semi-additive process. At this time, a seed layer was not etched. Next, a metal protrusion having a diameter of 15 μm and a height of 5 μm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

Example 10

An electrode pad was formed on a silicon wafer with plated copper having a diameter of 26 μm and a thickness of 2 μm at a position facing the bump position of "WALTS-TEG WM40-0102JY" using a semi-additive process. At this time, a seed layer was not etched. Next, a metal protrusion having a diameter of 14 μm and a height of 5 μm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

Example 11

An electrode pad was formed on a silicon wafer with plated copper having a diameter of 26 μm and a thickness of 2 μm at a position facing the bump position of "WALTS- TEG WM40-0102JY" using a semi-additive process. At this time, a seed layer was not etched. Next, a metal protrusion having a diameter of 17 μm and a height of 5 μm was formed on the surface of the prepared electrode pad similarly by using a semi-additive process, and eventually, the seed layer of the electrode pad was etched to prepare an electrode pad including a metal protrusion. This was diced into a size of 10 mm×8 mm and used for evaluation, and the other conditions were the same as in Example 1.

For the above-obtained semiconductor element mounting structures of Examples 6 to 11, misalignment after mounting was confirmed as follows. In addition, the semiconductor element mounting structures of Examples 1 to 5 and Comparative Examples 1 to 3 were evaluated in the same manner. Evaluation results are shown in Tables 2 and 3.

<Confirmation of Misalignment Between Silicon Chip and Substrate>

Misalignment was confirmed for a semiconductor element mounting structure in which a metal protrusion of a substrate was extended into a solder bump of a silicon chip such that the silicon chip was temporarily mounted on the substrate, and solder connection was performed by a heat treatment, by confirming misalignment between the solder bump of the silicon chip and the electrode pad of the substrate with an X-ray inspection system (Japan Nordson Advanced Technology K.K., trade name "XD-7600NT100-CT").

Misalignment was measured at 20 locations, and a ratio (percentage) of locations where misalignment between a bump of the silicon chip and an electrode pad of the substrate was less than 10 μm was determined.

TABLE 3

| | Comparative Example 1 | Comparative Example 2 | Comparative Example 3 |
|---|---|---|---|
| Shape of metal protrusion | — | Cylindrical column | Cylindrical column |
| Bottom area of metal protrusion (μm$^2$) | — | 452 | 380 |
| Maximum cross-sectional area of solder layer (μm$^2$) | 314 | 314 | 314 |
| Ratio of bottom area of metal protrusion/maximum cross-sectional area of solder layer (%) | — | 144 | 121 |
| Confirmation result of misalignment (%) | 0 | 10 | 15 |
| Remarks | — | — | — |

As shown in Tables 1 to 3, it can be seen that the semiconductor element mounting structure of the present disclosure is less likely to cause misalignment and has excellent connection accuracy.

The disclosure of Japanese Patent Application No. 2017-177487 filed on Sep. 15, 2017 is incorporated herein by reference in its entirety.

All publications, patent applications, and technical standards described herein are incorporated by reference herein to the same extent as if each individual publication, patent application, or technical standard was specifically and individually indicated to be incorporated by reference.

TABLE 2

| | Example 1 | Example 2 | Example 3 | Example 4 | Example 5 |
|---|---|---|---|---|---|
| Shape of metal protrusion | Rectangular parallelepiped | Rectangular parallelepiped × 2 | Rectangular parallelepiped | Cylindrical column | Two layers of cylindrical columns |
| Bottom area of metal protrusion (μm$^2$) | 60 | 120 | 100 | 201 | 201 |
| Maximum cross-sectional area of solder layer (μm$^2$) | 314 | 314 | 314 | 314 | 314 |
| Ratio of bottom area of metal protrusion/maximum cross-sectional area of solder layer (%) | 19 | 38 | 32 | 64 | 64 |
| Confirmation result of misalignment (%) | 100 | 100 | 95 | 80 | 85 |
| Remarks | — | — | — | — | — |

| | Example 6 | Example 7 | Example 8 | Example 9 | Example 10 | Example 11 |
|---|---|---|---|---|---|---|
| Shape of metal protrusion | Rectangular parallelepiped | Rectangular parallelepiped | Cylindrical column | Cylindrical column | Cylindrical column | Cylindrical column |
| Bottom area of metal protrusion (μm$^2$) | 60 | 60 | 211 | 177 | 154 | 227 |
| Maximum cross-sectional area of solder layer (μm$^2$) | 314 | 314 | 314 | 314 | 314 | 314 |
| Ratio of bottom area of metal protrusion/maximum cross-sectional area of solder layer (%) | 19 | 19 | 67 | 56 | 49 | 72 |
| Confirmation result of misalignment (%) | 95 | 100 | 80 | 90 | 95 | 30 |
| Remarks | Chip multi-layering | Underfill | — | — | — | — |

DESCRIPTION OF SYMBOLS

1 Semiconductor element
2 Metal post
3 Solder layer
4 Electrode pad
5 Metal protrusion
6 Substrate

What is claimed is:

1. A semiconductor element mounting structure, comprising:
    a semiconductor element comprising an element electrode, and a substrate comprising a substrate electrode that is provided on a surface facing the semiconductor element at a position facing the element electrode, the semiconductor element and the substrate being connected via the element electrode and the substrate electrode, wherein:
    one of the element electrode or the substrate electrode is a first protruding electrode comprising a solder layer at a tip portion thereof,
    the other of the element electrode or the substrate electrode is a first electrode pad comprising one or more metal protrusions on a surface thereof,
    the one or more metal protrusions of the first electrode pad extend into the solder layer of the first protruding electrode, and
    a bottom area of each of the one or more metal protrusions of the first electrode pad is 70% or less with respect to a maximum cross-sectional area of the solder layer of the first protruding electrode; and
    at least one further semiconductor element provided at an opposite side of the semiconductor element from the side facing the substrate, the at least one further semiconductor element being layered in a state such that each semiconductor element is connected via an element electrode, wherein:
    one of an element electrode of the semiconductor element provided at an opposite side of the semiconductor element from the side facing the substrate or an element electrode of the other further semiconductor element is a second protruding electrode comprising a solder layer at a tip portion thereof,
    the other of the element electrode of the semiconductor element provided at an opposite side of the semiconductor element from the side facing the substrate or the element electrode of the other further semiconductor element is a second electrode pad comprising one or more metal protrusions on a surface thereof,
    the one or more metal protrusions of the second electrode pad extend into the solder layer of the second protruding electrode, and
    a bottom area of each of the one or more metal protrusions of the second electrode pad is 70% or less with respect to a maximum cross-sectional area of the solder layer of the second protruding electrode.

2. The semiconductor element mounting structure according to claim 1, wherein a shape of each of the one or more metal protrusions is a cylindrical column or a rectangular parallelepiped.

3. The semiconductor element mounting structure according to claim 1, wherein each of the one or more metal protrusions has a shape wherein at least two cylindrical columns or rectangular parallelepipeds are stacked in a height direction.

4. The semiconductor element mounting structure according to claim 1, wherein each of the one or more metal protrusions is photolithographically formed.

5. The semiconductor element mounting structure according to claim 1, obtained by temporarily fixing the semiconductor element and the substrate in a state wherein at least a portion of the one or more metal protrusions of the first electrode pad is extended into the solder layer of the first protruding electrode by pressurization, and melting the solder layer of the first protruding electrode by heating to connect the element electrode and the substrate electrode.

6. The semiconductor element mounting structure according to claim 1, wherein the bottom area of each of the one or more metal protrusions of the first electrode pad is 50% or less with respect to a maximum cross-sectional area of the solder layer of the first protruding electrode, and the bottom area of each of the one or more metal protrusions of the second electrode pad is 50% or less with respect to a maximum cross-sectional area of the solder layer of the second protruding electrode.

7. The semiconductor element mounting structure according to claim 1, wherein the bottom area of each of the one or more metal protrusions of the first electrode pad is 10% or more with respect to a maximum cross-sectional area of the solder layer of the second protruding electrode, and the bottom area of each of the one or more metal protrusions of the second electrode pad is 10% or more with respect to a maximum cross-sectional area of the solder layer of the second protruding electrode.

8. A combination of a semiconductor element and a substrate, comprising:
    the semiconductor element comprising an element electrode, and the substrate comprising a substrate electrode that is provided on a surface facing the semiconductor element at a position facing the element electrode, wherein:
    one of the element electrode or the substrate electrode is a protruding electrode comprising a solder layer at a tip portion thereof,
    the other of the element electrode or the substrate electrode is an electrode pad comprising one or more metal protrusions on a surface thereof, and
    a bottom area of each of the one or more metal protrusions is 70% or less with respect to a maximum cross-sectional area of the solder layer of the protruding electrode; and
    at least one further semiconductor element provided facing the semiconductor element at an opposite side of the semiconductor element from the side facing the substrate, wherein:
    one of an element electrode of the semiconductor element provided at an opposite side of the semiconductor element from the side facing the substrate or an element electrode of the other further semiconductor element is a second protruding electrode comprising a solder layer at a tip portion thereof,
    the other of the element electrode of the semiconductor element provided at an opposite side of the semiconductor element from the side facing the substrate or the element electrode of the other further semiconductor element is a second electrode pad comprising one or more metal protrusions on a surface thereof, and
    a bottom area of each of the one or more metal protrusions of the second electrode pad is 70% or less with respect to a maximum cross-sectional area of the solder layer of the second protruding electrode.

9. The combination of a semiconductor element and a substrate according to claim 8, wherein the bottom area of each of the one or more metal protrusions is 50% or less with respect to a maximum cross-sectional area of the solder layer of the protruding electrode, and the bottom area of each of the one or more metal protrusions of the second electrode pad is 50% or less with respect to a maximum cross-sectional area of the solder layer of the second protruding electrode.

10. The combination of a semiconductor element and a substrate according to claim 8, wherein the bottom area of each of the one or more metal protrusions is 10% or more with respect to a maximum cross-sectional area of the solder layer of the protruding electrode, and the bottom area of each of the one or more metal protrusions of the second electrode pad is 10% or more with respect to a maximum cross-sectional area of the solder layer of the second protruding electrode.

11. A semiconductor element mounting structure, comprising:
    a semiconductor element comprising an element electrode, and a substrate comprising a substrate electrode that is provided on a surface facing the semiconductor element at a position facing the element electrode, the semiconductor element and the substrate being connected via the element electrode and the substrate electrode, wherein:
    one of the element electrode or the substrate electrode is a first protruding electrode comprising a solder layer at a tip portion thereof,
    the other of the element electrode or the substrate electrode is a first electrode pad comprising one or more metal protrusions on a surface thereof,
    the one or more metal protrusions of the first electrode pad extend into the solder layer of the first protruding electrode, and
    a bottom area of each of the one or more metal protrusions of the first electrode pad is 70% or less with respect to an area of the first electrode pad; and and
    at least one further semiconductor element provided at an opposite side of the semiconductor element from the side facing the substrate, the at least one further semiconductor element being layered in a state such that each semiconductor element is connected via an element electrode, wherein:
    one of an element electrode of the semiconductor element provided at an opposite side of the semiconductor element from the side facing the substrate or an element electrode of the other further semiconductor element is a second protruding electrode comprising a solder layer at a tip portion thereof,
    the other of the element electrode of the semiconductor element provided at an opposite side of the semiconductor element from the side facing the substrate or the element electrode of the other further semiconductor element is a second electrode pad comprising one or more metal protrusions on a surface thereof,
    the one or more metal protrusions of the second electrode pad extend into the solder layer of the second protruding electrode, and
    a bottom area of each of the one or more metal protrusions of the second electrode pad is 70% or less with respect to an area of the second electrode pad.

12. The semiconductor element mounting structure according to claim 11, wherein a shape of each of the one or more metal protrusions is a cylindrical column or a rectangular parallelepiped.

13. The semiconductor element mounting structure according to claim 11, wherein each of the one or more metal protrusions has a shape wherein at least two cylindrical columns or rectangular parallelepipeds are stacked in a height direction.

14. The semiconductor element mounting structure according to claim 11, wherein each of the one or more metal protrusions is photolithographically formed.

15. The semiconductor element mounting structure according to claim 11, obtained by temporarily fixing the semiconductor element and the substrate in a state wherein at least a portion of the one or more metal protrusions of the first electrode pad is extended into the solder layer of the first protruding electrode by pressurization, and melting the solder layer of the first protruding electrode by heating to connect the element electrode and the substrate electrode.

16. The semiconductor element mounting structure according to claim 11, wherein the bottom area of each of the one or more metal protrusions of the first electrode pad is 50% or less with respect to an area of the first electrode pad, and the bottom area of each of the one or more metal protrusions of the second electrode pad is 50% or less with respect to an area of the second electrode pad.

17. The semiconductor element mounting structure according to claim 11, wherein the bottom area of each of the one or more metal protrusions of the first electrode pad is 10% or more with respect to an area of the first electrode pad, and the bottom area of each of the one or more metal protrusions of the second electrode pad is 10% or more with respect to an area of the second electrode pad.

18. A combination of a semiconductor element and a substrate, comprising:
    the semiconductor element comprising an element electrode, and the substrate comprising a substrate electrode that is provided on a surface facing the semiconductor element at a position facing the element electrode, wherein:
    one of the element electrode or the substrate electrode is a protruding electrode comprising a solder layer at a tip portion thereof,
    the other of the element electrode or the substrate electrode is an electrode pad comprising one or more metal protrusions on a surface thereof, and
    a bottom area of each of the one or more metal protrusions is 70% or less with respect to an area of the electrode pad; and
    at least one further semiconductor element provided facing the semiconductor element at an opposite side of the semiconductor element from the side facing the substrate, wherein:
    one of an element electrode of the semiconductor element provided at an opposite side of the semiconductor element from the side facing the substrate or an element electrode of the other further semiconductor element is a second protruding electrode comprising a solder layer at a tip portion thereof,
    the other of the element electrode of the semiconductor element provided at an opposite side of the semiconductor element from the side facing the substrate or the element electrode of the other further semiconductor element is a second electrode pad comprising one or more metal protrusions on a surface thereof, and
    a bottom area of each of the one or more metal protrusions of the second electrode pad is 70% or less with respect to an area of the second electrode pad.

19. The combination of a semiconductor element and a substrate according to claim 18, wherein the bottom area of each of the one or more metal protrusions is 50% or less with respect to an area of the electrode pad, and the bottom area of each of the one or more metal protrusions of the second electrode pad is 50% or less with respect to an area of the second electrode pad.

20. The combination of a semiconductor element and a substrate according to claim 18, wherein the bottom area of each of the one or more metal protrusions is 10% or more with respect to an area of the electrode pad, and the bottom area of each of the one or more metal protrusions of the second electrode pad is 10% or more with respect to an area of the second electrode pad.

* * * * *